United States Patent
Merandat et al.

(10) Patent No.: US 7,746,154 B2
(45) Date of Patent: Jun. 29, 2010

(54) MULTI-VOLTAGE MULTIPLEXER SYSTEM

(75) Inventors: Marc Merandat, Bouc Bel Air (FR); Jean-Blaise Pierres, Aix-en-Provence (FR); Jerome Pratlong, Chelmsford (GB); Stephane Ricard, Bouc Bel Air (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/528,095

(22) Filed: Sep. 27, 2006

(65) Prior Publication Data

US 2008/0074166 A1    Mar. 27, 2008

(51) Int. Cl.
*H03K 17/00* (2006.01)

(52) U.S. Cl. .................. 327/408; 327/407; 327/534; 327/537

(58) Field of Classification Search ......... 327/407–413, 327/534–537
See application file for complete search history.

(56) References Cited

U.S. PATENT DOCUMENTS

| | | | | |
|---|---|---|---|---|
| 5,157,291 A | * | 10/1992 | Shimoda | 327/408 |
| 5,376,813 A | | 12/1994 | Delbruck et al. | |
| 5,808,502 A | * | 9/1998 | Hui et al. | 327/333 |
| 6,133,777 A | * | 10/2000 | Savelli | 327/410 |
| 6,222,384 B1 | | 4/2001 | Kim | |
| 6,222,385 B1 | | 4/2001 | Kang | |
| 6,353,356 B1 | * | 3/2002 | Liu | 327/536 |
| 7,005,911 B1 | | 2/2006 | Om'mani | |
| 7,423,472 B2 | * | 9/2008 | Hirose et al. | 327/407 |
| 2004/0169543 A1 | | 9/2004 | Doutreloigne et al. | |
| 2006/0197601 A1 | | 9/2006 | Bernard et al. | |

FOREIGN PATENT DOCUMENTS

| | | |
|---|---|---|
| EP | 0627807 A2 | 12/1994 |
| WO | WO-2008039622 A1 | 4/2008 |
| WO | WO-2008039623 A1 | 4/2008 |

OTHER PUBLICATIONS

"International Application Serial No. PCT/US2007/076923, Search Report mailed Mar. 4, 2008", 1 pg.

* cited by examiner

*Primary Examiner*—Lincoln Donovan
*Assistant Examiner*—Patrick O'Neill
(74) *Attorney, Agent, or Firm*—Schwegman, Lundberg & Woessner, P.A.

(57) ABSTRACT

A multi-voltage multiplexer system includes multiple voltage inputs, each voltage input providing a different input voltage, and multiple control inputs operative to select one of the input voltages for output. Each of multiple transistors is connected to a different one of the voltage inputs and to a different one of the control inputs, and the transistors are connected to an output such that the selected input voltage is provided at the output. A bulk of each of the transistors is connected together to form a bulk network, and the bulk network is connected to the gate of each transistor such that the transistors connected to non-selected voltage inputs have gates set at approximately the maximum of the input voltages.

13 Claims, 3 Drawing Sheets

MULTI-VOLTAGE MULTIPLEXER SYSTEM

FIELD OF THE INVENTION

The present invention relates to multiplexers, and more particularly to multiplexers receiving multiple different voltage levels as inputs.

BACKGROUND OF THE INVENTION

Multiplexers are used in a wide variety of applications to select one or more of several different inputs as an output. In some applications, different voltage levels are provided as different inputs to a circuit, to provide different functionality depending on the voltage level input that is selected by the multiplexer. For example, in some integrated circuit applications such as Flash or EEPROM memories, there is a need to have, on the same circuit net, one given voltage level during one operation (such as writing) and another voltage level during a different operation (such as reading). Analog applications may also require multiple voltage level supplies to output on a common net.

In some applications, the inputs can have very different voltage levels. Digital control signals are typically the most suitable signals to select which of the inputs is provided to the circuit. In many such circuits, the output voltage is desired to be identical to the selected input voltage, with little or no voltage drop caused by the multiplexer. In addition, high reliability of the multiplexer is desired, so that the selected input voltage is output with minimal variation and fluctuations during dynamic behavior (such as a different selection of input to the multiplexer).

FIG. 1 is a schematic diagram of one type of prior multiple voltage multiplexer 10. Multiplexer 10 receives multiple voltage inputs, each input providing a different voltage value. For example, inputs V1, V2 and V3 can be 1.2 volts, 5 volts, and 15 volts, respectively. Digital control signals CTRL1, CTRL2, and CTRL3 are used to select the desired input voltage to be output by the multiplexer, where these signals select voltages V1, V2, and V3, respectively, to be output. One control signal is set to a high level to allow the associated voltage to be output, while the other control signals are set low.

Each control signal is input to a level shifter 12a, 12b, or 12c, which also receives an level input of the voltage V1, V2, or V3 as shown. When the control signal is low, a level shifter 12 provides a low signal (zero voltage) as the output signal OUT1, OUT2, or OUT3. When the control signal is high, the input voltage V1, V2, or V3 is provided as the output OUT1, OUT2, or OUT3 of the level shifter, respectively. This allows a control signal of any digital voltage to be shifted to the proper voltage level needed for the multiplexer to function.

A native transistor device 14a, 14b and 14c is connected to the OUT1, OUT2, and OUT3 signals, respectively, at the gates of the transistors. The voltage V1, V2, or V3 is connected to the source of the transistor 14a, 14b, 14c, respectively, and the drains of the transistors are connected to a $V_{OUT}$ output node. These native devices have the property of having a threshold voltage of Vt close to −0.1 volts. This means that these devices are off with a gate to source voltage below −0.1 volts and on with a gate to source voltage above −0.1 volts.

If voltage V1 is desired to be transferred onto $V_{OUT}$, then the CTRL1 signal is asserted (set high). Level shifter 12a outputs the voltage V1 to the gate of the transistor 14a, and the voltage V1 on the source is passed to $V_{OUT}$ with a voltage drop equivalent to the native transistor threshold voltage of transistor 14a, including the body effect of the transistor. This body effect can be considered negligible if V1 stays around 1 or 2 volts. However, the body effect can reach 0.3 volts as soon as V1 reaches 15 volts. The other pass transistors 14b and 14c are off because their gate to source voltage is $-V_{OUT}$ or −V2 or −V3, which is less than −0.1 volts.

Thus, if an input voltage level is high, such as 12 or more volts, the body effect is not negligible and provides a significant voltage drop on the output voltage. This characteristic creates a significant disadvantage for the multiplexer of FIG. 1 in many applications, because the output signal has a different value than the input voltage signal to the multiplexer (signal integrity loss).

FIG. 2 is schematic illustration of a different prior multiple voltage multiplexer 20. As in the circuit of FIG. 1, different voltage inputs V1, V2, and V3 can be input to the multiplexer 20, and one of these inputs can be selected to be output onto the $V_{OUT}$ output node. The control signals CTRL1, CTRL2, and CTRL3 similarly select which of the input voltages is propagated onto the $V_{OUT}$ node.

In multiplexer 20, inverters 22a, 22b, and 22c are connected to the control signals CTRL1, CTRL2, and CTRL3, respectively. The inverted control signal is input to a level shifter 24a, 24b, or 24c, which provides a signal OUT1, OUT2, or OUT3, respectively. As in the circuit of FIG. 1, the level shifters 24a, 24b, and 24c are provided with an input carrying the voltage V1, V2, or V3, respectively. Each level shifter output signal is connected to the gate of a transistor 26a, 26b, or 26c, which is connected to voltage V1, V2, or V3 at its source, respectively, and to the $V_{OUT}$ output node at its drain. Transistors 26a, 26b, and 26c are PMOS transistors, non-native devices that can hold the maximum driven input voltage, and have their bulk terminals connected to their drains.

If voltage V1 is desired to be transferred to $V_{OUT}$, then the CTRL1 signal is asserted (set high) and the other control signals are set low. The CTRL1 signal is inverted by inverter 22a to a low signal that is input to level shifter 24a, and level shifter 24a outputs a zero voltage to the gate of the transistor 26a. This allows the voltage V1 to pass to $V_{OUT}$ without any voltage drop by the transistor 26a. At this time, the bulk of the transistor 26a, which is connected to the $V_{OUT}$ node, is lower than V1 for a given amount of time until V1 is transferred to $V_{OUT}$. Depending on this delay (based on the $V_{OUT}$ load and initial Vbulk voltage) or on the dynamic behavior of the $V_{OUT}$ node when switching to different voltage inputs, the transistor 26a can stay with a bulk to source voltage much below (−0.6) volts. This biasing injects a strong current into the n-well of the transistor 26a, triggering PNP bipolar transistor behavior, and resulting in a short or long term reliability issue of the transistor 26a so that the transistor may not function properly under these conditions. For reliable transistor operation, it is desired to keep the PMOS bulks at Vb+0.5v>Vs, where Vb is the bulk voltage and Vs is the source voltage; this is especially true when $V_{OUT}$ is switching from one voltage level to another. Multiplexer 20 does not maintain such voltages. In addition, this second scheme does not work if V1 is selected (by signal CTRL1) and V2 is greater than V1. In such a case, $V_{OUT}$ is approximately equal to V1, and Vbs of transistor 26a is (V1−V2), which is less than zero. If (V1−V2) is less than about −0.5 volts, this will lead to a reliability issue. In other words, this second scheme requires specific input voltage level control for V1, V2, and V3.

Thus, both these existing multiplexer designs provide disadvantages, either in the form of an undesired voltage drop, or in unreliable behavior under certain conditions.

Accordingly, what is needed is a multiplexer that can multiplex multiple inputs providing different voltages, without any significant voltage drop and without reliability issues. The present invention addresses such a need.

SUMMARY OF THE INVENTION

The invention of the present application relates to multiplexers selecting from multiple different voltage input levels. In one aspect of the invention, a voltage multiplexer includes a plurality of voltage inputs, each voltage input providing a different input voltage, and a plurality of control inputs operative to select one of the input voltages for output. A plurality of transistors are also included, each transistor connected to a different one of the voltage inputs and to a different one of the control inputs, and the transistors are connected to an output such that the selected input voltage is provided at the output. A bulk of each of the transistors is connected together to form a bulk network, and the bulk network is connected to the gate of each transistor such that the transistors connected to non-selected voltage inputs have gates set at approximately the maximum of the input voltages.

In another aspect of the invention, a voltage multiplexer includes a plurality of voltage inputs, each voltage input providing a different input voltage, and a plurality of control inputs operative to select one of the input voltages for output. Also included are a plurality of level shifters, each level shifter coupled to a different one of the control inputs. Each of a plurality of first transistors is connected to a different one of the voltage inputs at its source and to a different one of the level shifters at its gate, the first transistors connected to an output at their drains such that the selected input voltage is provided at the output. A bulk of each of the first transistors is connected together to form a bulk network, and the bulk network is connected to an input of each of the level shifters such that each first transistor connected to a non-selected voltage input has its gate set at approximately the maximum of the input voltages. Each of a plurality of second transistors is connected between one of the voltage inputs and the bulk network, and functions as a diode.

In another aspect of the invention, a method for multiplexing voltage inputs having different voltage levels includes providing a plurality of voltage inputs, each voltage input providing a different input voltage, and receiving, on a plurality of control inputs, signals to select one of the input voltages for output. A plurality of transistors are provided, each transistor connected to a different one of the voltage inputs and to a different one of the control inputs, the plurality of transistors connected to an output. The selected input voltage is provided at the output without a voltage drop. Approximately the maximum of the input voltages is provided to the gate of each transistor connected to non-selected voltage inputs such that the non-selected transistors are reliably turned off.

The present invention provides a voltage multiplexer that can accept multiple inputs of different voltage levels and select one of the voltage inputs for output by the multiplexer, without having a voltage drop from input to output. In addition, the present invention greatly increases the reliability of transistor operation during dynamic behavior of the multiplexer.

DETAILED DESCRIPTION

The present invention relates to relates to multiplexers, and more particularly to multiplexers receiving multiple different voltage levels as inputs. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The present invention is mainly described in terms of particular circuits provided in particular implementations. However, one of ordinary skill in the art will readily recognize that this circuit will operate effectively in other implementations.

To more particularly describe the features of the present invention, please refer to FIG. 3 in conjunction with the discussion below.

Figure 3:
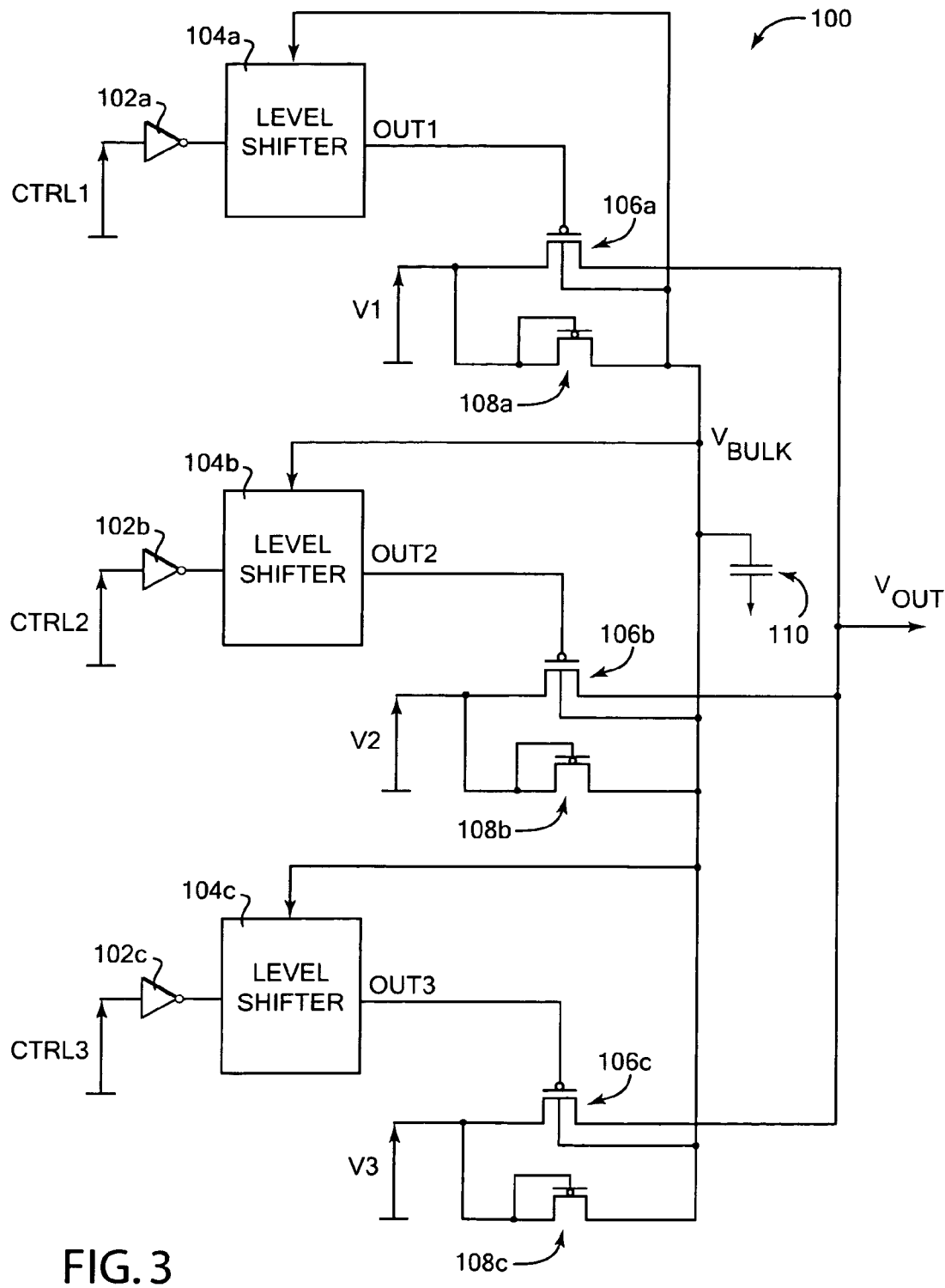
FIG. 3 is a schematic view of a multiplexer of the present invention for selecting from multiple different voltage inputs.

FIG. 3 is a schematic view of a voltage multiplexer 100 of the present invention. Multiplexer 100 can be implemented on a semiconductor substrate including use of native transistor devices as detailed below and other discrete components. Alternatively, the multiplexer 100 can be implemented using all discrete components.

Multiplexer 100 receives multiple voltage inputs, each input typically providing a different voltage value. For example, inputs V1, V2 and V3 can be 3 volts, 5 volts, and 12 volts, respectively. Other voltage values can be used in other examples. Control signals CTRL1, CTRL2, and CTRL3 are used to select the desired input voltage to be output by the multiplexer, where these signals allow voltages V1, V2, and V3, respectively, to be output. One of the control signals is set to a digital high level to allow the selected voltage to be output by the multiplexer at output net $V_{OUT}$, while the other control signals for non-selected input voltages are set to a digital low level.

Each control signal is input to an inverter 102 to invert the digital level of the control signal, where signal CTRL1 is input to inverter 102a, signal CTRL2 is input to inverter 102b, and signal CTRL3 is input to inverter 102c. A level shifter 104 is connected to the output of each inverter 102, where level shifter 104a is connected to inverter 102a, level shifter 104b is connected to inverter 102b, and level shifter 104c is connected to inverter 102c. Each level shifter 104 has an output that is based on the control signal provided at the input to that level shifter. For example, level shifter 104a provides an output signal OUT1, level shifter 104b provides an output signal OUT2, and level shifter 104c provides an output signal OUT3. Each level shifter 104 also receives a bulk voltage $V_{BULK}$ as its level input, as explained in greater detail below. The bulk voltage is provided to the output of a level shifter 104 when the control signal input at that level shifter is high. This allows a control signal of any digital voltage to be shifted to the desired voltage level needed for multiplexer operation. In other embodiments, inverters 102 can be omitted, and the level shifter can function similarly as described above based on opposite digital signals to those described above.

Multiplexer 100 includes a transistor 106 associated with each control signal and level shifter. Transistors 106 are provided as PMOS transistor devices in the embodiment of FIG. 3. Each level shifter output signal is connected to the gate of a transistor 106, where signal OUT1 is connected to the gate of a transistor 106a, signal OUT2 is connected to the gate of a transistor 106b, and signal OUT3 is connected to the gate of a transistor 106c.

The voltage V1, V2, and V3 is connected to the source of the associated transistor 106, where voltage V1 is connected to the source of transistor 106a, voltage V2 is connected to the source of transistor 106b, and voltage V3 is connected to the source of transistor 106c. The drain of each of the transistors 106 is connected to the $V_{OUT}$ node. The bulk connection of each transistor 106 is connected to a bulk network $V_{BULK}$, which is also provided as the level input to each level shifter 104 as shown.

The multiplexer 100 also includes a transistor 108 connected to each of the transistors 106. Transistors 108 are native NMOS transistors in the embodiment shown, and can be provided as embedded devices in semiconductor or analog devices. These types of transistors typically have very low threshold voltages (Vt), such as 0 volts. These native devices have the property of being in an off state with a gate to source voltage of zero volts, and when their source is biased higher than two volts; they turn off (without leakage) due to the body effect.

The gate and drain of each transistor 108 is connected to the input voltage V1, V2, or V3, where gate and drain of transistor 108a are connected to voltage V1, gate and drain of transistor 108b are connected to voltage V2, and gate and drain of transistor 108c are connected to voltage V3. The sources of the transistors 108 are connected to the $V_{BULK}$ network. A capacitor 110 can be coupled between the $V_{BULK}$ network and ground to reduce noise on the $V_{BULK}$ network and increase stability during dynamic operation, e.g. when voltage swings occur due to a different input voltage being selected.

The multiplexer 100 operates as follows. If it is desired to transfer the voltage V1 to $V_{OUT}$, then the CTRL1 signal is set high and the other control signals are set low. The connected inverter 102a inverts the control signal to low and the low signal is sent to the level shifter 104a. A low signal input to the level shifter provides the output OUT1 as a 0 voltage signal, which sets the gate of transistor 106a to zero voltage. This allows the transistor 106a to pass the V1 voltage to $V_{OUT}$ without any voltage drop.

The native transistor devices 108a, 108b, and 108c are connected so that they act as diodes. These transistors, and the bulks of transistors 106 being connected together, cause the $V_{BULK}$ node to be set to the maximum voltage between voltages V1, V2, and V3, with a voltage drop due to the threshold voltage body effect of the native transistors 108a, 108b, and 108c. For example, for a typical native transistor 108 the body effect voltage drop can be about 0.3 volts for a 12 volt input voltage.

If a different voltage (V2 or V3) is desired to be transferred to $V_{OUT}$ and voltage V1 is not desired to be transferred to $V_{OUT}$, then CTRL2 or CTRL3 is set high. The V2 or V3 voltage (whichever is selected) is transferred to $V_{OUT}$ similarly to V1 as in the example above. To de-select the voltage V1, the CTRL1 signal is set low. The CTRL1 signal is inverted to a high signal by the inverter 102a and this digital high signal is input to the level shifter 104a, which allows $V_{BULK}$ at the voltage level input to the level shifter to be provided as the OUT1 signal to the gate of transistor 106a.

As explained above, $V_{BULK}$ is set to the highest voltage of V1, V2, and V3 with a voltage drop from the body effect of the native transistors 108, i.e., (Vmax−Vbodyeffect). This means that the transistor 106a has a gate to source voltage as follows:

$Vgs=V_{BULK}-V1$

Therefore, if V1 is the maximum voltage Vmax of (V1, V2, V3), then, $Vgs=(V1-Vbodyeffect)-V1$ $Vgs=-Vbodyeffect>-0.3$ volts Thus, for transistor 106a to have a gate to source voltage greater than the threshold voltage, the transistor 106a should have a threshold voltage Vt that is a significantly under the body effect voltage drop (e.g., −0.3 volts for a maximum input voltage level of 12 volts), thereby making sure that the transistor 106a is off with the above biasing. Typical PMOS transistors for high voltage circuitry have a thick oxide layer and have a threshold voltage of about −0.7 or −0.8 volts, which fits this condition for transistors 106.

If V2 is the maximum voltage Vmax of (V1, V2, V3), then for transistor 106a, $Vgs=(V2-Vbodyeffect)-V1$ $Vgs>0$ Since the gate to source voltage is greater than zero, transistor 106a is always off because it is a PMOS transistor. A similar result occurs when V3 is the maximum voltage of the input voltages. The same functionality applies to the transistors 106b and 106c of the multiplexer 100 when selected or non-selected for output.

Figure 1:
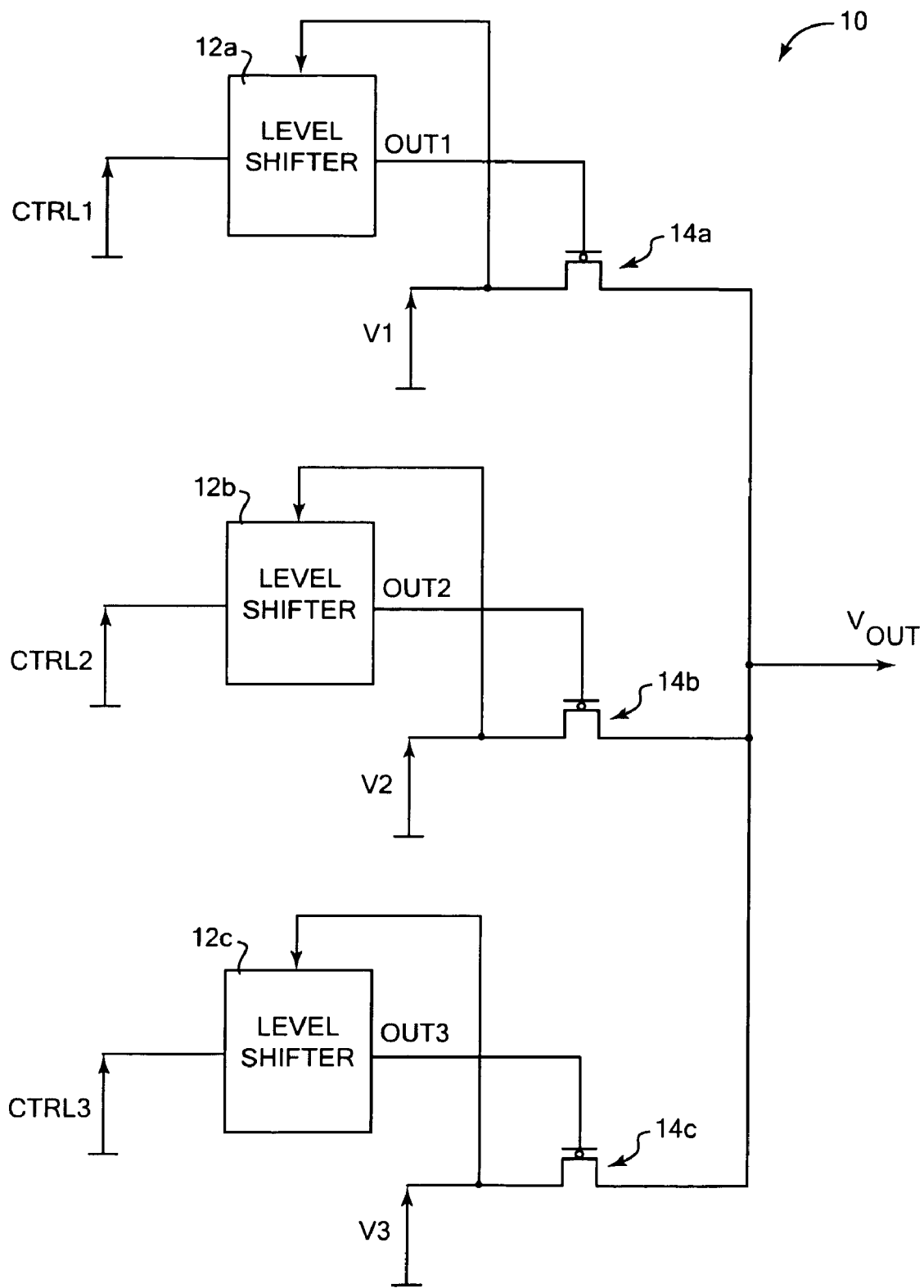
FIG. 1 is a schematic view of a first prior multiplexer receiving multiple voltage inputs.

After one of the input voltages has been selected to be output using the control signals, the present invention provides a selected input voltage to the output $V_{OUT}$ with a zero voltage drop. Thus the invention has clear advantages over the prior art multiplexer 10 of FIG. 1, which creates a voltage drop on $V_{OUT}$ if the input voltage is high.

Figure 2:
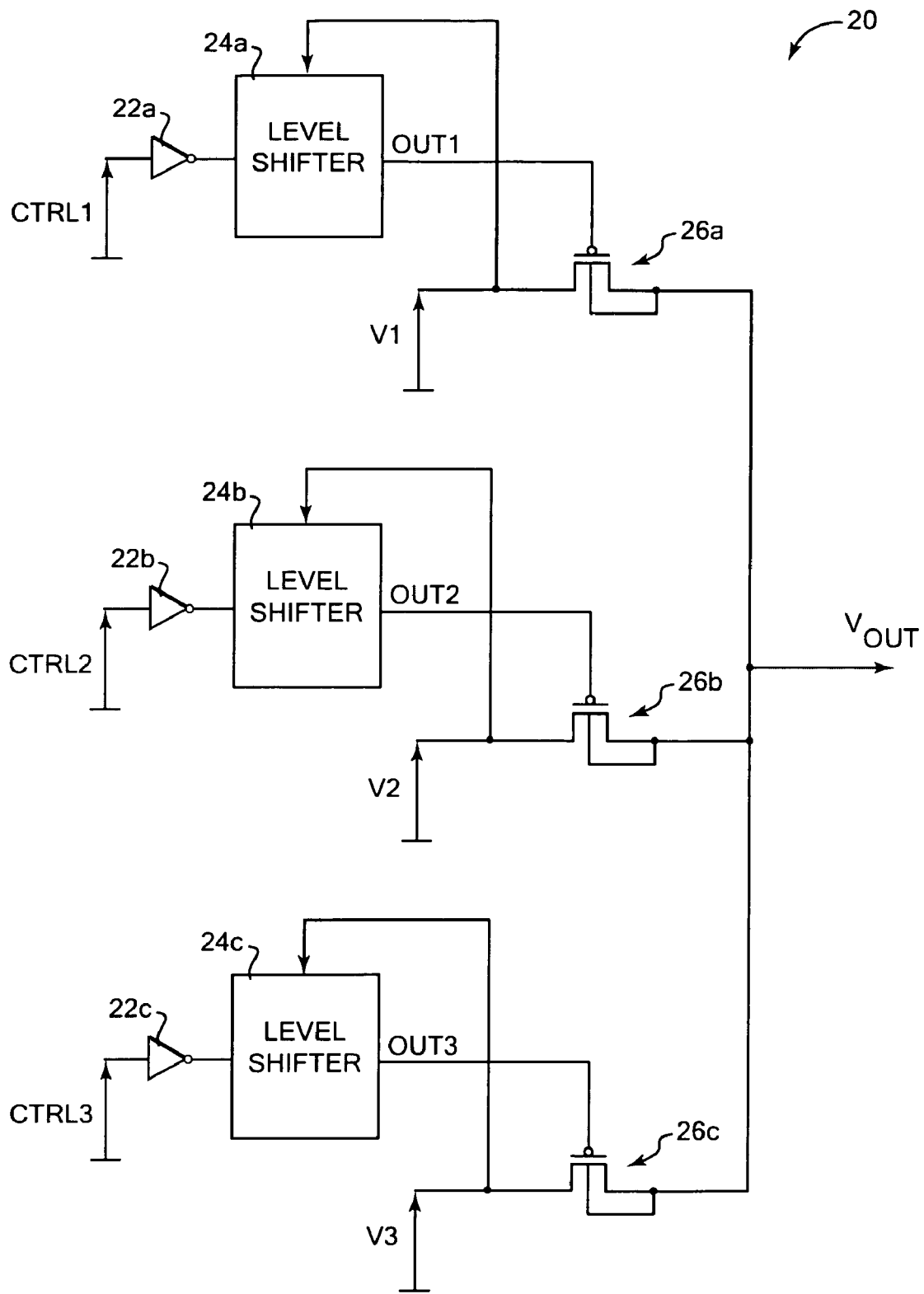
FIG. 2 is a schematic view of a second prior multiplexer receiving multiple voltage inputs.

The present invention also provides greater stability and reliability to the transistor operation. The prior art multiplexer 20 of FIG. 2 allows a zero voltage drop from input voltage to output, but has the disadvantage of providing unreliable operation. This can occur, for example, when the bulk voltage of the PMOS transistor is about 0.5 volts less than the source or drain voltage of the transistor. This occurs because the prior art multiplexer applies the associated input voltage to the gate of the transistor 26 to turn it off; however, this associated input voltage may be much more than the selected output voltage appearing at $V_{OUT}$ and the bulk of the transistor 26 due to another input voltage being selected for $V_{OUT}$, and this smaller bulk voltage can cause the transistor to not function properly. For reliable transistor operation, it is desired to always keep the PMOS bulks at Vb+0.5v>Vs, where Vb is the bulk voltage and Vs is the source voltage; this is especially true when $V_{OUT}$ is switching from one voltage level to another. The prior art multiplexer 20 of FIG. 2 does not maintain these voltages.

The present invention avoids such reliability problems. The maximum of the input voltages (minus a small body effect voltage) is applied to the gates of all the PMOS transistors 106 in the multiplexer that are connected to input voltages that are not selected for output, thus turning off those transistors reliably and maintaining their off state even when a voltage is switched for output on $V_{OUT}$ that is much lower than the associated input voltage for a transistor 106. The native transistor devices 108 have a very small body effect voltage, providing a small enough voltage drop on the maximum of the input voltages to avoid any reliability problems for the transistors 106.

The multiplexer configuration example of FIG. 3 of the present invention works most effectively at voltage levels between 1.5 volts and 12 to 15 volts. Voltage levels outside this range can be used, depending on the native transistors 108 used in the circuit. If, for example, one of the input voltages V1, V2, or V3 is above 12.5 volts, the $V_{BULK}$ network will stay a few tenths of volts below that input voltage from the body effect voltage drop of the associated native device 108 that is a typical native device. Thus, the bulk to source voltage on the associated transistor 106 would start to reach a few tenths of a volt, which increases the possibility of unreliable transistor operation. In addition, if one of the input voltages is below 2.5 volts, for example, a typical native transistor 108 may start to leak from the $V_{BULK}$ network to the input voltage source, because the body effect is not high enough to switch the transistor 108 off.

Transistor device characteristics and sizes can be altered to accommodate such input voltage ranges outside the most effective range, and/or to address the desired target switching speed and other circuit characteristics. For example, to prevent the bulk to input voltage leakage at low voltage levels, a transistor 108 with a higher threshold voltage Vt can be used instead of the native transistor 108; for example, a device having a medium Vt at +0.25 volts can be used. In such an embodiment, since the input voltage is low (e.g., below 2.5 volts), the body effect across the native transistor 108 is low, and the body effect across the higher threshold transistor is acceptable.

The multiplexer of the present invention allows multiple voltage levels to be used, whether the three levels shown in the example of FIG. 3, or more voltage levels. In prior art multiplexers, only two voltage levels were typically used in order to manage the bulk voltages of the PMOS devices and reduce reliability problems, and thus are significantly more limited than the present invention.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A voltage multiplexer comprising:
   a plurality of voltage inputs operative to provide a plurality of voltages having different voltage values;
   a plurality of control inputs operative to select a selected voltage from the plurality of voltages;
   a plurality of first transistors, each first transistor of the plurality of first transistors connected to a different one of the plurality of voltage inputs and to a different one of the plurality of control inputs, the plurality of first transistors operative to provide the selected voltage to an output based on values of signals at the plurality of control inputs and independent of the voltage values of the plurality of voltages, wherein a bulk of each first transistor of the plurality of first transistors is connected together to form a bulk network that is connected to a gate of each first transistor of the plurality of first transistors, such that the plurality of first transistors connected to non-selected voltages from the plurality of voltages have gates set at an approximate maximum value among the different voltage values, and wherein the plurality of voltage inputs are not directly connected to a plurality of level shifters that include inputs connected to the plurality of control inputs and outputs connected to the gates of the plurality of first transistors; and a plurality of second transistors coupled to the plurality of first transistors, each second transistor of the plurality of second transistors including a gate and a drain both connected to one of the plurality of voltage inputs and a source connected to the bulk network, wherein each second transistor of the plurality of second transistors has a threshold voltage of zero volts.

2. The voltage multiplexer of claim 1 wherein the plurality of first transistors are PMOS transistors.

3. The voltage multiplexer of claim 1 wherein the approximate maximum value is equal to a highest voltage value among the different voltage values minus a body effect voltage value of the second transistor that is connected to one of the plurality of voltage inputs with the highest voltage value.

4. The voltage multiplexer of claim 1 wherein the plurality of voltage inputs include at least three voltage inputs.

5. The voltage multiplexer of claim 1 wherein a voltage drop between the output and one of the plurality of voltage inputs associated with the selected voltage is approximately zero volts when the selected voltage is provided at the output.

6. The voltage multiplexer of claim 1 further comprising a plurality of inverters, each inverter of the plurality of inverters coupled between one of the plurality of control inputs and an associated level shifter of the plurality of level shifters.

7. The voltage multiplexer of claim 1 further comprising a capacitor connected between the bulk network and a ground potential.

8. A voltage multiplexer comprising:
   a plurality of voltage inputs operative to provide a plurality of voltages having different voltage values;
   a plurality of control inputs operative to select a selected voltage from the plurality of voltages;
   a plurality of level shifters, each level shifter of the plurality of level shifters coupled to a different one of the control inputs, wherein the plurality of voltage inputs are not directly connected to the plurality of level shifters such that the plurality of voltages are not directly provided to the plurality of level shifters;
   a plurality of first transistors, each first transistor of the plurality of first transistors connected to a different one of the plurality of voltage inputs at a source thereof and to a different one of the plurality of level shifters at a gate thereof, the plurality of first transistors operative to provide the selected voltage to an output based on values of signals at the plurality of control inputs and independent of the voltage values of the plurality of voltages, the output being connected to drains of the plurality of first transistors, wherein a bulk of each transistor of the plurality of first transistors is connected together to form a bulk network that is connected to an input of each level shifter of the plurality of level shifters, such that each first transistor of the plurality of first transistors connected to a non-selected voltage from the plurality of voltages has a gate thereof set at an approximate maximum value among the different voltage values; and
   a plurality of second transistors coupled to the plurality of first transistors, each second transistor of the plurality of second transistors including a gate and a drain both connected to one of the plurality of voltage inputs and a source connected to the bulk network, wherein each second transistor of the plurality of second transistors has a threshold voltage of zero volts.

9. The voltage multiplexer of claim 8 wherein the first transistors are PMOS transistors.

10. The voltage multiplexer of claim 8 wherein the approximate maximum value is equal to a highest voltage value among the different voltage values minus a body effect voltage value of the second transistor connected to one of the plurality of voltage inputs with the highest voltage value.

11. The voltage multiplexer of claim 8 wherein the plurality of voltage inputs include at least three voltage inputs.

12. The voltage multiplexer of claim 8 wherein a voltage drop between the output and one of the plurality of voltage inputs associated with the selected voltage is approximately zero volts when the selected voltage is provided at the output.

13. A method comprising:
   providing a plurality of voltages having different voltage values to a plurality of voltage inputs;
   receiving signals at a plurality of control inputs;
   selecting a selected voltage from the plurality of voltages using a selected level shifter of a plurality of level shifters in which the selected level shifter responds to one of the signals at the plurality of control inputs, wherein the plurality of voltages are not directly provided to the plurality of level shifters;
   transferring the selected voltage to an output using a selected transistor of a plurality of first transistors that are connected between the plurality of voltage inputs and the output, wherein transferring the selected voltage to the output using the selected transistor is based on values of the signals at the plurality of control inputs and independent of the voltage values at the plurality of voltages;
   providing an approximate maximum voltage value among the different voltage values to a gate of each non-selected transistor of the plurality of first transistors that is connected to a non-selected voltage of the plurality of voltages to turn off each non-selected transistor;
   connecting a plurality of second transistors to the plurality of first transistors, such that a gate and a drain of each second transistor of the plurality of the second transistors are connected to one voltage input of the plurality of voltage inputs, and such that a source of each second transistor of the plurality of the second transistors is connected to a bulk network formed by a bulk of each transistor of the plurality of the first transistors; and
   selecting a threshold voltage of the plurality of second transistors to prevent leakage from the bulk network to each non-selected transistor of the plurality of first transistors when one of the different voltage values at the plurality of voltage inputs is less than a selected input value, wherein selecting the threshold voltage includes selecting zero volts for the threshold voltage.

\* \* \* \* \*